United States Patent [19]

Challa

[11] Patent Number: 5,414,658
[45] Date of Patent: May 9, 1995

[54] ELECTRICALLY ERASABLE PROGRAMMABLE READ-ONLY MEMORY ARRAY

[75] Inventor: Nagesh Challa, Sunnyvale, Calif.

[73] Assignee: Nexcom Technology, Inc., Sunnyvale, Calif.

[21] Appl. No.: 245,189

[22] Filed: May 17, 1994

Related U.S. Application Data

[60] Continuation of Ser. No. 136,438, Oct. 13, 1993, which is a division of Ser. No. 896,772, Jun. 10, 1992, Pat. No. 5,297,081, which is a continuation-in-part of Ser. No. 625,807, Dec. 11, 1990, Pat. No. 5,222,040.

[51] Int. Cl.⁶ ............................................. G11C 13/00
[52] U.S. Cl. ..................................... 365/185; 365/218
[58] Field of Search ................ 365/49, 185, 189.01, 365/189.03, 218, 230.08

[56] References Cited

U.S. PATENT DOCUMENTS

| | | | |
|---|---|---|---|
| 4,366,555 | 12/1982 | Hu | 365/185 |
| 4,519,076 | 5/1985 | Priel et al. | 365/201 X |
| 4,698,787 | 10/1987 | Mukherjee et al. | 365/185 |
| 4,758,986 | 7/1988 | Kuo | 365/185 |
| 4,884,239 | 11/1989 | Ono et al. | 365/185 |
| 4,903,236 | 2/1990 | Nakayama et al. | 365/185 |
| 4,949,309 | 8/1990 | Rao | 356/900 X |
| 4,996,571 | 2/1991 | Kume et al. | 357/23.5 |
| 4,996,668 | 2/1991 | Paterson et al. | 365/185 |
| 5,099,297 | 3/1992 | Hazani | 365/189.01 |
| 5,126,808 | 6/1992 | Montalvo et al. | 365/900 X |
| 5,163,021 | 11/1992 | Mehrotra et al. | 365/201 X |
| 5,222,040 | 6/1993 | Challa | 365/185 |

FOREIGN PATENT DOCUMENTS

0218342 4/1987 European Pat. Off. .
0313427 4/1989 European Pat. Off. .

OTHER PUBLICATIONS

Gill et al, "A 5-Volt Contactless Array 256KBit Flash EEPROM Technology," 1988 IEEE, pp. 428–431.
Robinson, "Endurance Brightens the Future of Flash," Technological Horizons, Nov. 1988, pp. 167–169.
Wilson et al, "Intel Flash Prices Rock Market," Electronic Engineering Times, Apr. 27, 1992, p. 1 and p. 93.

Primary Examiner—Terrell W. Fears
Attorney, Agent, or Firm—Skjerven, Morrill, MacPherson, Franklin & Friel

[57] ABSTRACT

A memory (1) operative in an erase mode, a program mode, or a read mode includes a memory cell array, word lines (30, 40, 50, 60), a row decoder (9) connected to the word lines, bit lines (2, 4, 6, 8), a precharge circuit (70, 72, 74, 76, 78, 80) connected to the bit lines, a load circuit (22, 23, 24, 25, 26, 27, 28, 29) connected to the bit lines, and a sense circuit (12, 14, 16, 18) connected to the bit lines. The memory array includes both floating gate MOSFET transistors and switch MOSFET transistors arranged in groups associated with respective subsets of word lines and bit lines. Within each group, the sources of the floating gate transistors (32, 34, 42, 44) and switch transistors (35, 45) are commonly connected, the control gates and drains of the floating gate transistors are respectively connected to a unique associated word line (30, 40)—associated bit line (2, 4) pair, and each of the switch transistors has its gate connected to a unique associated word line and its drain connected to a reference line (5). The sense current threshold is set between an amount of current drawn by one ON floating gate transistor and an amount of current drawn by a number of OFF floating gate transistors equal to the number of floating gate transistors within a group connected to a single bit line, minus one.

32 Claims, 5 Drawing Sheets

ELECTRICALLY ERASABLE PROGRAMMABLE READ-ONLY MEMORY ARRAY

CROSS-REFERENCE TO RELATED APPLICATIONS

This patent is a continuation of application Ser. No. 08/136,438, filed Oct. 13, 1993, which is a divisional of application Ser. No. 07/896,772, filed Jun. 10, 1992, now U.S. Pat. No. 5,297,081, which is a continuation-in-part of application Ser. No. 07/625,807, filed Dec. 11, 1990, now U.S. Pat. No. 5,222,040.

BACKGROUND OF THE INVENTION

1. Field of Use

The present invention relates to memory arrays, and more particularly to memory arrays using settable threshold memory cells.

2. Description of Related Art

Various memory arrays have been developed using various types of settable threshold memory cells. For example, one conventional type of array, which is described in FIG. 5a of U.S. Pat. No. 4,698,787, issued Oct. 6, 1987 to Mukherjee et al., uses a two transistor electrically erasable programmable read only memory ("E²PROM") cell. One transistor of this cell is a select transistor. The other transistor of this cell is a floating gate transistor in which Fowler-Nordheim tunneling is used to transport charge to or from the floating gate for storing a binary value by selectively setting the transistor to either a low threshold voltage ("$V_t$") state or a high $V_t$ state. The charge is transported through a tunnel dielectric insulating the transistor drain from the floating gate. As various conventions appear in the literature for the terms "erase" and "program," the terms low $V_t$ and high $V_t$ are used herein when generally referring to the state of a memory cell. Typically, about twenty volts is needed to alter the $V_t$ state of the transistor. In a typical E²PROM memory array, initially all cells of the cell array are placed into a high $V_t$ state by grounding the drain and pulsing the gate at a potential of about plus twenty volts. Then, the desired logic value is written into the array by placing selected cells into a low $V_t$ state by grounding the gate and pulsing the drain of the selected cells at a potential of about plus twenty volts. The select transistor, then, is used for the purposes of: (1) isolating deselected cells from selected cells while the bit lines are pulsed to set low $V_t$; and (2) isolating deselected cells from selected cells during memory read operations, which prevents deselected cells that were written into depletion from drawing current from the bit lines to give a false state indication. Unfortunately, a cell array based on the two transistor cell consumes considerable space on the die because of the size of the two transistor cell, thereby seriously limiting the size of an integrated circuit memory.

Various memory cell arrays have been proposed that are not based on the two transistor cell. For example, U.S. Pat. No. 4,903,236, issued Feb. 20, 1990 to Nakayama et al., discloses an array in FIG. 5 that uses a particular combination of high voltages on the word and bit lines purportedly to avoid the need for a two transistor cell, even though a two transistor cell is preferred.

The previously mentioned Mukherjee et al. patent discloses in FIG. 5b another array based on a single asymmetrical source/drain E²PROM memory cell that is placed into a high $V_t$ state using hot electrons in a manner similar to conventional EPROM transistors, and placed into a low $V_t$ state in a manner similar to a conventional E²PROM cell except that the tunnel dielectric is located between the source and the floating gate. In this array, initially all cells of the array are placed in a low $V_t$ state by grounding the word lines and pulsing the common source line. A byte erase scheme is also proposed in FIG. 5d of Mukherjee et al. that incorporates an additional transistor for each word. Cells are placed in a high $V_t$ state by channel hot electron injection into the floating gate, which is achieved by (a) grounding the common source line, raising the drain voltage of the selected cells, and pulsing the gate of the selected cells with positive voltage. Channel hot electron injection occurs in only selected cells having a raised drain voltage. Selected cells having a grounded drain do not assume a high $V_t$ state since they lack channel hot electron generation, and deselected cells do not assume a high $V_t$ state since they lack hot electron transport.

The memory cell used in the Mukherjee et al. array is a type of E²PROM cell commonly known as flash memory. Flash memory technology as it is generally referred to involves channel hot electron injection to achieve the high $V_t$ state, and Fowler-Nordheim tunneling to achieve the low $V_t$ state. Flash memory is described in further detail in K. Robinson, "Endurance Brightens the Future of Flash," Electronic Component News, November 1988.

As generally envisioned, flash memory cells are single transistors cells. A flash memory avoids over-erasure of its cells into depletion by using a complex and time consuming software-implemented technique. For example, to write a byte of data into a flash memory, a block of the flash memory is selected, preconditioned, erased, and entirely rewritten. This process can take hundreds of milliseconds. See R. Wilson and D. Lammers, "Intel flash prices rock market," Electronic Engineering Times, Apr. 27, 1992, p. 92-93.

Flash memory typically has several disadvantages. Because of the techniques generally used to prevent individual cells from over-erasing into depletion, a write operation is cumbersome and time-consuming, requiring typically hundreds of milliseconds. Because setting the high $V_t$ state relies on channel hot electron injection, each memory cell being set into the high $V_t$ state draws considerable current, typically as much as a milliampere. The high power consumption limits, as a practical matter, the number of cells that can be set into the high $V_t$ state at a time. Typically, the limit is eight cells. Moreover, the voltage required for setting the memory cells in a high $V_t$ state must be obtained from an external source because of the power requirement.

A flash memory cell has been developed that use Fowler-Nordheim tunnelling for both programming and erasure; see Gill et al., "A 5-Volt Contactless Array 256 Kbit FLASH EEPROM Technology," Proceedings IEDM, 1988, pp. 428-431. The cell is operated using a particular combination of voltages on the word and bit lines. The cell includes an integral pass gate, since it is used in a memory architecture in which cells erased into depletion are problematic. Although the cell is somewhat smaller due to its use of an integral pass gate, nonetheless the cell is larger and more complicated than a conventional flash cell.

SUMMARY OF THE INVENTION

Various advantages are realized by the present invention. Memory arrays based on the present invention have densities on the order of flash memory arrays, and can be implemented in various technologies including flash and conventional E²PROM technology. Memories based on the present invention operate at low power and require only a single low voltage power supply. Memories based on the present invention are programmed in about 5 milliseconds, and may be designed for page mode programming with variable page size.

In one embodiment of the invention, a memory array operative in an erase mode, a program mode, or a read mode comprises a pair of settable threshold memory cells, each having a control terminal and first and second controlled terminals. Suitable memory cell designs include single-transistor cells fabricated with conventional E²PROM technology or flash technology. The cell threshold is set by application of a voltage across the control terminal and the first controlled terminal, which in the case of a conventional E²PROM-type cell or a flash-type cell would be across the control gate and drain respectively. The memory array also comprises a pair of switches having a control terminal and first and second controlled terminals. The switches may be simple MOSFET transistors, for example. An array reference line, which may be a ground line, is connected to the respective first controlled terminals of the switches. The respective second controlled terminals of the switches are connected to one another by a common line. A bit line is connected to the first controlled terminals of the memory cells. The second controlled terminals of the memory cells are connected to the common line. One word line is connected to the control terminals of one of the memory cells and one of the switches, while another word line is connected to the control terminals of the other memory cell and the other switch.

DESCRIPTION OF THE PREFERRED EMBODIMENT

Figure 1:
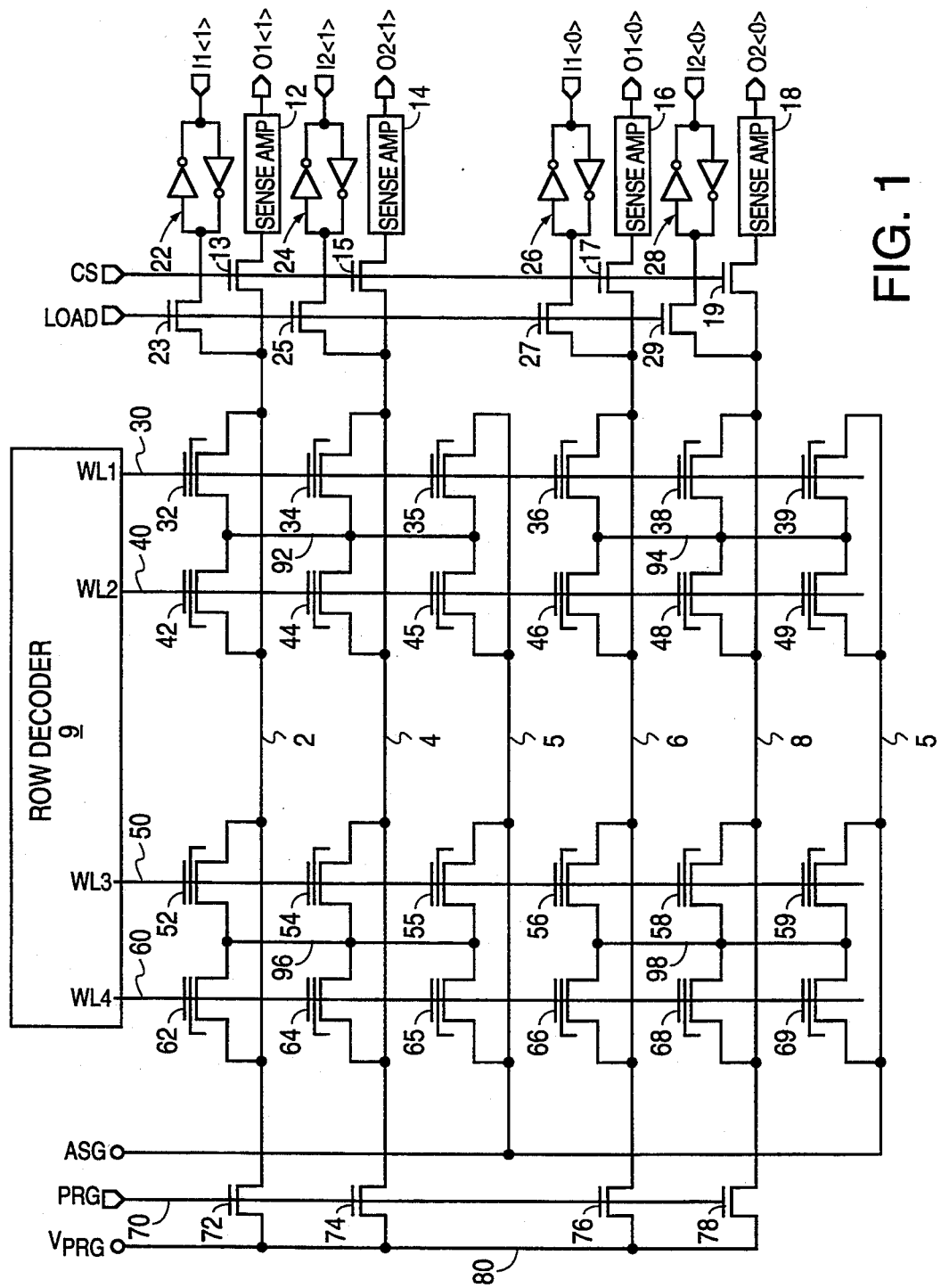
FIG. 1 is a circuit schematic diagram of a memory array.

A page mode memory architecture 1 is shown in FIG. 1. Memory 1 includes a four by four array of settable threshold memory cells, which illustratively are shown as floating gate transistors or, more specifically, as flash-technology implemented n-channel floating gate MOSFET transistors 32, 34, 36, 38, 42, 44, 46, 48, 52, 54, 56, 58, 62, 64, 66 and 68. The number of cells in the memory array is illustrative, having been selected to simplify explanation. Illustratively, the memory contains eight two-bit bytes, and is accessed in page mode with variable page size. In practice, memory arrays typically range from one thousand cells to sixteen million cells, although a greater or lesser number of memory cells may be used depending on the application and process technology.

The memory array in memory 1 includes four row lines 30, 40, 50 and 60, and four column lines 2, 4, 6 and 8. In memory 1, the row lines may be thought of as word or page lines, and the column lines may be thought of as bit lines. The basic circuit of the memory cell array is a number of pairs of floating gate transistors such as first pair 32 and 42 and second pair 34 and 44, associated with a pair of ground (or more generally reference voltage) decode transistors such as n-channel MOSFET transistors 35 and 45. The transistor pairs 32 and 42, 34 and 44, and 35 and 45 have a common source line 92. The drains of paired transistors 32 and 42 are connected to a common bit line, which is bit line 2 in FIG. 1. Similarly, the drains of paired transistors 34 and 44 are connected to common bit line 4. The drains of the paired ground decode transistors 35 and 45 are connected to an assign ground (or more generally, reference potential) line 5. One transistor of each pair (for example floating gate transistors 32 and 34 and transistor 35) share a common word line (for example, word line 30). This basic circuit arrangement is repeated, albeit with different word line—bit line associations, in the group comprising transistors 36, 46, 38, 48, 39 and 49, the group comprising transistors 52, 62, 54, 64, 55 and 65, and the group comprising transistors 56, 66, 58, 68, 59 and 69.

Circuits peripheral to the memory cell array include row decoder 9 having illustrative word line outputs WL1, WL2, WL3 and WL4 connected to word lines 30, 40, 50 and 60 respectively. The bit line precharge circuit comprises, illustratively, n-channel MOSFET transistors 72, 74, 76 and 78, the gates of which are connected to a common precharge control line 70, the sources of which are connected to a common precharge voltage line 80, and the drains of which are connected to respective bit lines 2, 4, 6 and 8. The first output byte O1<1:0> and the second output byte O2<1:0> of a page are furnished by sense amplifiers 12, 14, 16 and 18. Sense amplifiers 12, 14, 16 and 18 are controllable coupled to respective bit lines 2, 4, 6 and 8 by n-channel column select MOSFET transistors 13, 15, 17 and 19, the gates of which receive the column select signal CS. The first input byte I1<1:0> and the second input byte I2<1:0> of a page are furnished to latches 22, 24, 26 and 28. Latches 22, 24, 26 and 28 are controllable coupled to respective bit lines 2, 4, 6 and 8 by load n-channel MOSFET load transistors 23, 25, 27 and 29, the gates of which receive the load signal LOAD. Various other arrangements and combinations of sense amplifier and column select transistors are known and can be used instead of the described arrangement to achieve other output configurations.

Note that in the memory cell array of FIG. 1, the common source lines 92, 94, 96 and 98 of the various groups of transistors form virtual grounds, and that the ground decode transistors function to decode the ground for the cells associated with selected word lines. For example, if word line 30 is selected by placing an appropriate voltage on port WL1, transistors 35 and 39 turn ON, thereby bringing the common source line 92 associated with floating gate transistors 32, 42, 34 and 44 to ground, and thereby bringing the common source line 94 associated with floating gate transistors 36, 46, 38 and 48 to ground. Transistors 32, 34, 36 and 38 become "selected" transistors because their sources are grounded and an appropriate voltage is applied to their gates. Transistors 42, 44, 46 and 48 are deselected transistors, because although their sources are also grounded, the word line 40 is deselected by port WL2. Transistors 52, 54, 56 and 58 are also deselected transistors, because their sources are floating and the word line 50 is deselected by port WL3. Similarly, transistors 62, 64, 66 and 68 are deselected transistors, because their sources are floating and the word line 60 is deselected by port WL4.

Note that in the memory 1 of FIG. 1, the bits of each byte of data are distributed respectively across the memory banks. A bank of cells is a group of cells associated with a specific number of adjacent bit lines. In the memory 1, the number of adjacent bit lines forming a bank corresponds with the number of bytes contained within a row of the memory array, and the number of banks corresponds with the number of bits in a byte. In other words, any one particular bank contains memory cells belonging to different bytes. Contrast this arrangement with memory arrangements in which the number of adjacent bit lines forming a bank corresponds with the number of bits in a byte, and the number of banks corresponds with the number of bytes contained within a row of the memory array.

While the memory 1 may be based on either bank arrangement, the distributed byte bank arrangement is preferred to the one byte per bank arrangement when the memory array common lines 92, 94, 96 and 98 are implemented as a doped region in a semiconductor material. This is because the doped region is a comparatively poor conductor relative to metal, and a voltage drop occurs in the doped region when current flows through the region. In a one byte per bank arranged memory, this voltage drop may be disadvantageous in some operating modes.

Figure 2:
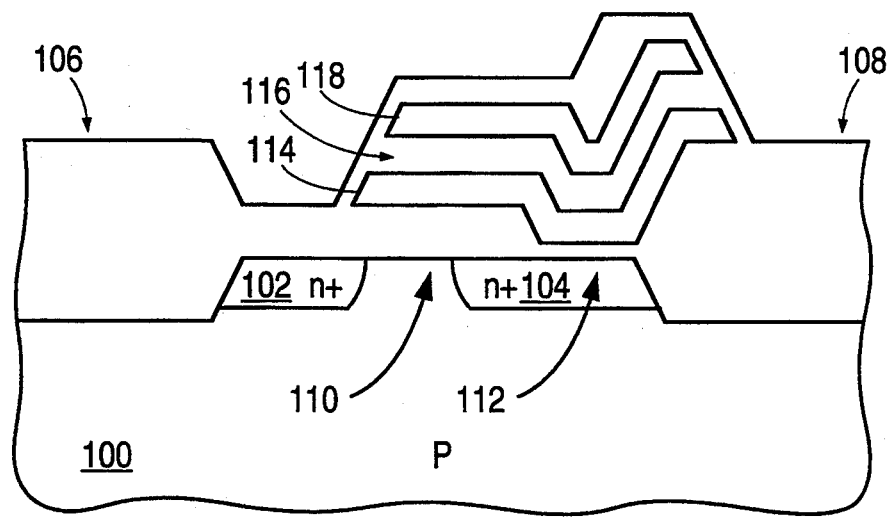
FIG. 2 is a cross section of a memory transistor implemented in E²PROM technology.
Figure 3:
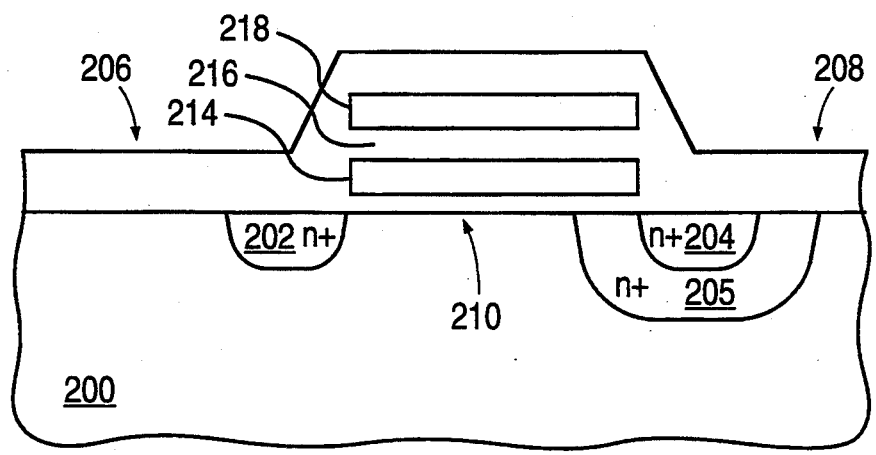
FIG. 3 is a cross section of a memory transistor implemented in FLASH memory technology.

Each of the memory cells of FIG. 1 is a settable threshold device. Suitable devices are illustrated in FIGS. 2 and 3 and are described in numerous publications, including the compendium by Cheming Hu, Nonvolatile Semiconductor Memories, IEEE Publications, New York, 1991. The device of FIG. 2 is a floating gate transistor fabricated in accordance with a conventional E²PROM process. Source 102 and drain 104 are formed in substrate 100, within an active area bounded by field oxide 106 and 108. A floating gate 114 is provided over the channel region between the source 102 and drain 104, and is insulated from the channel by a gate dielectric 110. A portion of the floating gate 114 also overlays a portion of the drain 104, from which it is insulated by a thin tunnel dielectric 112. A control gate 118 overlays the floating gate 114, and is insulated from the floating gate 114 by an interpoly dielectric 116. The device of FIG. 3 is a floating gate transistor fabricated in accordance with a conventional flash memory process. Source 202 and a double diffused drain comprising sections 204 and 205 are formed in substrate 200, within an active area bounded by dielectric 206 and 208. A floating gate 214 is provided both over the drain region 205 and over the channel region between the source 202 and drain region 205, and is insulated therefrom by a uniform dielectric layer 210, which comprises both gate and tunnel dielectric. A control gate 218 overlays the floating gate 214, and is insulated from the floating gate 214 by an interpoly dielectric 216. Although the cell of FIG. 3 shows a double diffused drain comprising regions 204 and 205, a suitable underlay can be achieved without double diffusion. Moreover, although the source region 202 is shown with essentially no underlay, a source region having greater underlay may be fabricated if desired. Processes suitable for fabricating the transistors of FIGS. 2 and 3 are well known in the art.

Programming and erasing of a floating gate transistor such as those shown in FIGS. 2 and 3 is based on Fowler-Nordheim tunneling. The value of $V_t$ is variable, depending on the type and thickness of the dielectric (the "coupling ratio") through which the tunneling occurs, as well as the voltage applied and the nature and duration of application. Illustratively, a suitable coupling ratio is 0.65.

The memory 1 of FIG. 1 operates as follows, assuming use of the illustrative floating gate MOSFET described above. Two illustrative sets of voltage are summarized in Tables 1 and 2 below for both selected and deselected rows in erase, write, and read modes. Illustratively, the voltages are applied for a duration (pulse) of five milliseconds. It will be appreciated that these values are illustrative, and that similar operation can be achieved using different values of voltage, and even different types of adjustable threshold memory cells.

TABLE 1

| MODE | STATUS | VWL | VBL | VASG | VSUB | Vt |
| --- | --- | --- | --- | --- | --- | --- |
| ERASE | Selected | 20 | 0 | 0 | 0 | >4 |
|  | Deselected | 0 | 0 | 0 | 0 | Unchanged |
| WRITE | Selected | −15 | 5 (bin 0) | 0 | 0 | −1 |
|  |  |  | 0/F (bin 1) | 0 | 0 | >4 |
|  | Deselected | −1 | 5/0 | 0 | 0 | Unchanged |
| READ | Selected | 2.5 | 1.5 | 0 | 0 |  |
|  | Deselected | 0 | F | 0 | 0 |  |

TABLE 2

| MODE | STATUS | VWL | VBL | VASG | VSUB | Vt |
| --- | --- | --- | --- | --- | --- | --- |
| ERASE | Selected | 15 | −4 | −4 | −4 | >4 |
|  | Deselected | −4 | −4 | −4 | −4 | Unchanged |
| WRITE | Selected | −15 | 5 (bin 0) | 0 | 0 | −1 |
|  |  |  | 0/F (bin 1) | 0 | 0 | >4 |
|  | Deselected | −1 | 5/0 | 0 | 0 | Unchanged |
| READ | Selected | 2.5 | 1.5 | 0 | 0 |  |
|  | Deselected | 0 | F | 0 | 0 |  |

"Erase" mode is defined as establishing a high $V_t$ in the memory transistors of the memory 1 so that they are nonconductive in the read mode. As nonconductive cells are sensed as logic one in the read mode, the result of an erase is to place logic ones into the memory cells associated with a selected row. Assume, for example, that erasure of transistors 32, 34, 36 and 38 associated with word line 30 is desired. Selected word line 30 is taken to a high voltage such as 20 volts (alternatively, 15 volts), while the deselected word lines 40, 50 and 60 are held at 0 volts (alternatively minus 4). All bit lines 2, 4, 6 and 8 are held at 0 volts (alternatively minus 4), and the assign ground line 5 is held at zero volts (alternatively minus 4). Transistors 32, 34, 36 and 38 thereby have twenty volts (alternatively 19) applied across their respective control gates and drains with the control gate positive relative to the drain, so that electrons tunnel from the drain through the tunnel oxide to the floating gate to raise $V_t$ to greater than four volts. All other transistors in the memory array of the memory 1 have zero volts (alternatively minus four volts) applied across their respective control gates and drains, which is insufficient to disturb the data in these cells. Of course, the entire memory array of the memory 1 can be erased, if desired, by taking all of the word lines 30, 40, 50 and 60 to 20 volts (alternatively 15 volts).

The alternative erase mode set of voltages of Table 2 in which ($V_{WL}$, $V_{BL}$) is (15, −4) for selected words and (−4, −4) for deselected words is useful when PMOS drivers are used for the word lines. For any given CMOS process, typically PMOS device breakdown voltage is less than NMOS device breakdown voltage. While the voltage set of Table 1 may be suitable for NMOS word line drivers, the twenty volts for the selected word line may be excessive for PMOS word line drivers. The solution is to apply just less than the PMOS breakdown voltage (e.g. fifteen volts) to the selected word line, and apply a suitable negative voltage (e.g. minus four volts) to the bit lines and to the substrate so that electrons tunnel from the drain and/or from the substrate through the tunnel oxide to the floating gate to raise $V_t$ in the transistors associated with the selected word line to a suitable value (e.g. greater than four volts).

"Write" mode is defined as establishing a low $V_t$ in particular memory transistors of the memory 1 so that they are conductive in the read mode. The memory 1 is configured as a page mode memory in which a page of data is loaded into latches 22, 24, 26 and 28, and transferred into an entire row of memory cells in the write operation. Assume, for example, that the binary value "10" is to be written into the first byte of memory, and the binary value "11" is to be written into the second byte of memory. This is accomplished by latching a logic one in latch 22 and a logic zero in latch 26, the first byte being divided across the two banks of the memory array on word line 30, and latching a logic one in latches 24 and 28, the second byte being divided across the two banks of the memory array on word line 30. Accordingly, latches 22, 24 and 28 furnish zero volts on their outputs (alternatively, the outputs may be made to float) while latch 26 furnishes five volts on its output. Word line 30 is brought to minus fifteen volts, while word lines 40, 50 and 60 are brought to minus one volt. Signal LOAD is asserted positive, thereby turning on the load transistors 23, 25, 27 and 29. Zero volts (or alternatively no voltage if the latch outputs are floating) is applied to bit lines 2, 4 and 8, while five volts is applied to bit line 6. The fifteen volts across the control gates and drains of transistors 32, 34 and 38, with the control gates being negative relative to the drains, is insufficient to cause tunneling. Hence, the logic one erased state of those transistors is unchanged with their $V_t$ being greater than four volts. The twenty volts across the control gate and drain of transistor 36, with the control gate being negative relative to the drain, is sufficient to cause tunneling. Tunneling proceeds from the floating gate to the drain, which causes the $V_t$ of transistor 36 is lowered to about minus one volt. Hence, transistor 36 is actually written into depletion. The zero to five volts across the control gates and drains of the other memory transistors in the memory array is insufficient to cause tunneling, so that the logic state of those transistors is unchanged.

Minus one volt is applied to the deselected word lines to prevent write errors and prevent unnecessary power dissipation. The likelihood that deselected words will have ON cells is great. Were zero volts applied to the deselected words, some of the ON cells in depletion mode could, in conjunction with a common line such as 92, 94, 96 or 98, for example, establish a conduction path between a bit line having a five volt level and a bit line having a zero volt level. The resulting current flow unnecessarily dissipates power and disrupts voltage levels on the bit lines, thereby potentially causing write errors. Applying minus one volt, or more generally a voltage equal to or less than the anticipated negative $V_t$ of memory transistors driven into depletion, ensures that the conduction path does not form.

In read mode, the value programmed into selected memory transistors of the memory array of memory 1 are read correctly without the interference of other memory cells. Read mode begins by precharging all bit lines 2, 4, 6 and 8 to 1.5 volts. Typically, the common source lines 92, 94, 96 and 98 also are precharged, since the word lines 30, 40, 50 and 60 are held at zero volts and at least one of the cells associated with each common line is likely to be an ON cell that conducts because it was driven into depletion.

If the first page of memory 1 is being read, word line 30 is brought to 2.5 volts, while word lines 40, 50 and 60 are held at zero volts. Word line 30 is 2.5 volts, which causes the common source lines 92 and 94 to be brought to ground through source ground decoding transistors 35 and 39. Transistor 36 is in a programmed, or low $V_t$, state of about minus one volt, so that transistor 36 conducts heavily. The current flow on bit line 6 is detected by sense amplifier 16, which reads the current flow as a logic zero. Bit line 6 corresponds to the second bit of the first byte of the selected word. Transistors 32, 34 and 38 are in a high $V_t$ state of greater than four volts, so the 2.5 volts on word line 30 is insufficient to turn them ON. Hence, transistors 32, 34 and 38 contribute no current flow to the respectively associated bit lines 2, 4 and 8.

Nonetheless, the current flow on the respectively associated bit lines 2, 4 and 8 is not necessarily zero. For example, if transistor 42 is in a negative $V_t$ state, it will conduct like a depletion mode device because its source is grounded and its associated deselected word line is at zero volts. Accordingly, sense amplifiers 12, 14, 16 and 18 are designed so that their current sense threshold is greater that the current equivalent to an ON cell that has its gate at zero volts, but less than the current equivalent to an ON cell that has its gate at 2.5 volts. Note that if the common lines 92, 94, 96 and 98 are implemented as doped semiconductor regions, their low but possibly significant resistance should be taken into account in determining the current equivalent of an ON cell that has its gate at zero volts. Accordingly, even though transistor 42 causes a current to flow in bit line 2, the current is below the sense threshold of sense amplifier 12, which therefor reads a logic one.

Because both word lines 50 and 60 are zero, none of the source ground decoding transistors is ON and none of the memory transistors 52, 54, 56, 58, 62, 64, 66 or 68 are able to sustain conduction. Even should one or more of these transistors have a negative $V_t$, it will not contribute current to the bit lines. This is because the associated common source line 96 and/or 98 would have been charged up to the bit line voltage through the ON cell during the precharge phase. Hence, no current is contributed to the bit lines 2, 4, 6 and 8 during the read operation, and no interference with the read operation is experienced.

In general, a plurality "n" of memory transistors associated with the same bit line may share a common source line, the character of which, grounded or floating, is determined by an equal plurality "n" of source ground decoding transistors. In this general case, the sense amplifier for the bit line would be designed so that its current sense threshold is greater than the current equivalent to "n−1" ON memory cells that have their gates at zero volts, but less than the current equivalent to an ON memory cell that has its gate at 2.5 volts.

Alternatively, a negative voltage at or below the negative $V_t$ of memory cells programmed into depletion, instead of the reference, can be applied to the deselected word lines in read mode. In this event, even if transistor 42 is in a negative $V_t$ state, it will not conduct though its source be grounded, and sense amplifiers 12, 14, 16 and 18 may be designed so that their current sense threshold is zero.

However, maintaining read mode voltages within the supply voltage, which for a typical three or five volt supply means avoiding the use of negative word line voltages, allows faster read mode operation. For example, to generate negative two volts from a three or five volt supply requires a suitable voltage converter. Because of their small layout size, charge pumps are commonly employed to obtain negative voltages. Unfortunately, charge pumps, especially those using small transistors to minimize layout space, require several clock cycles in which to form the negative voltage, during which a memory such as the memory 1 of FIG. 1 generally would be inactive. These would be wasted clock cycles. Hence, maintaining read mode voltages within the supply voltage is preferred.

Figure 4:
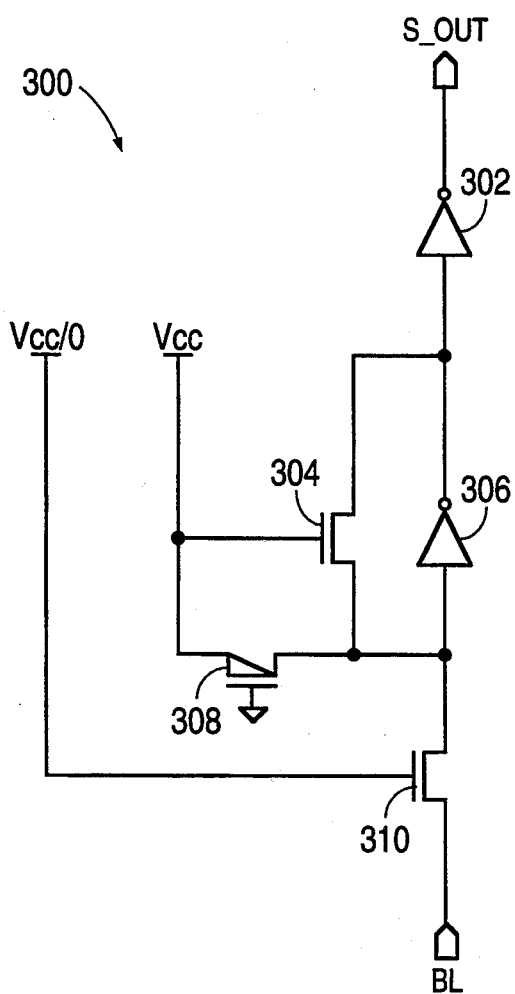
FIG. 4 is a schematic diagram of a sense amplifier.

An illustrative sense amplifier 300, which is suitable for use as sense amplifiers 12, 14, 16 and 18 in the memory 1 of FIG. 1, is shown in FIG. 4. Inverter 306 is provided with a feedback circuit comprising n-channel transistor 304 and p-channel transistor 308. The current sense threshold of the sense amplifier 300 is determined by the size of these transistors, in a manner well known in the art. Inverter 302 buffers the output of inverter 306.

The sense amplifier 300 operates as follows. When the current drain from the bit line BL is zero or below the threshold set by transistors 304 and 308, the voltage at the input of inverter 306 is sufficient to prevent the inverter 306 from changing state. When the current drawn from the bit line BL is equal to or exceeds the threshold, the output of the inverter 306 changes from logic zero to logic one.

Figure 5A:
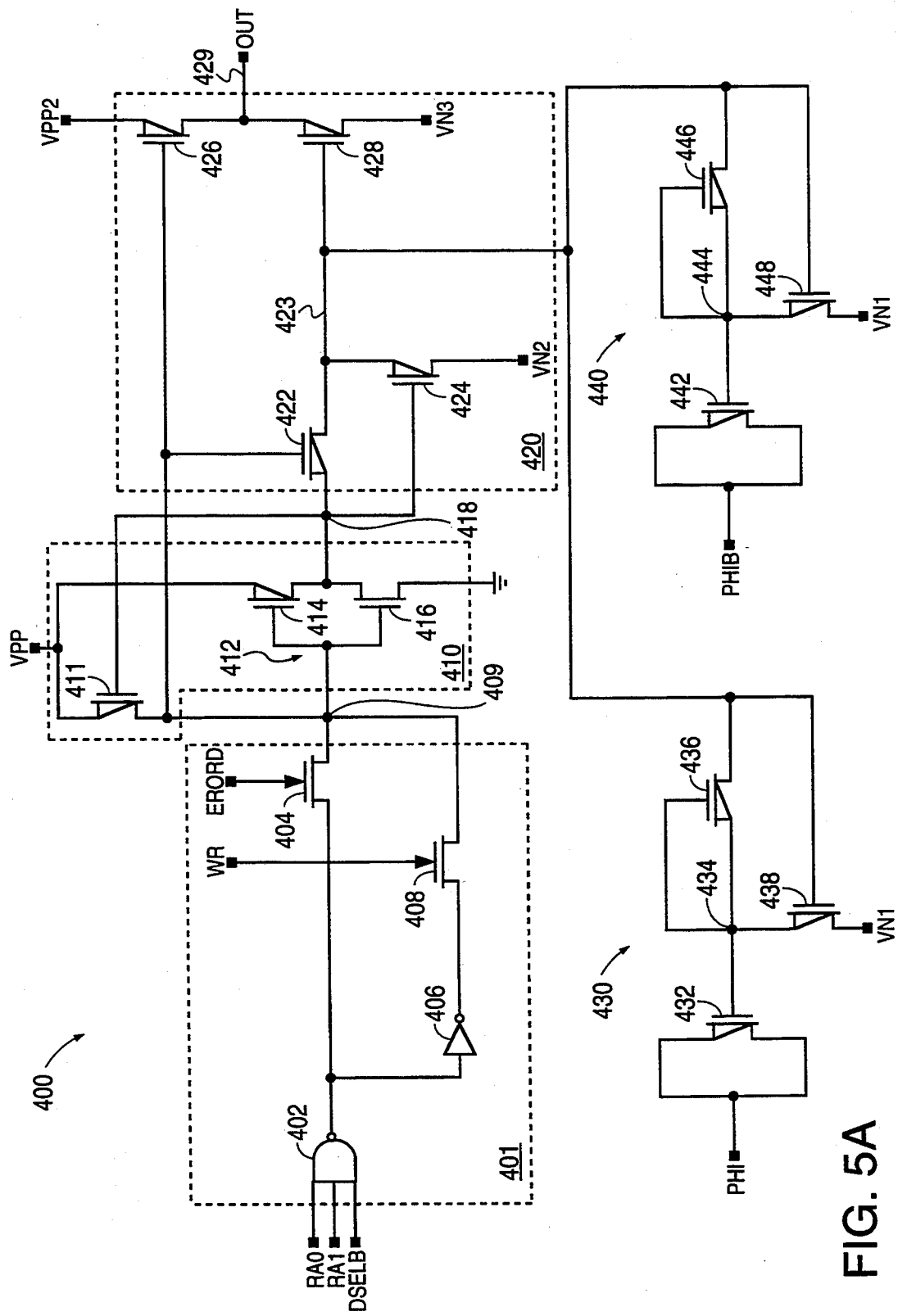
FIGS. 5A and 5B are schematic diagrams of a row decoder.
Figure 5B:
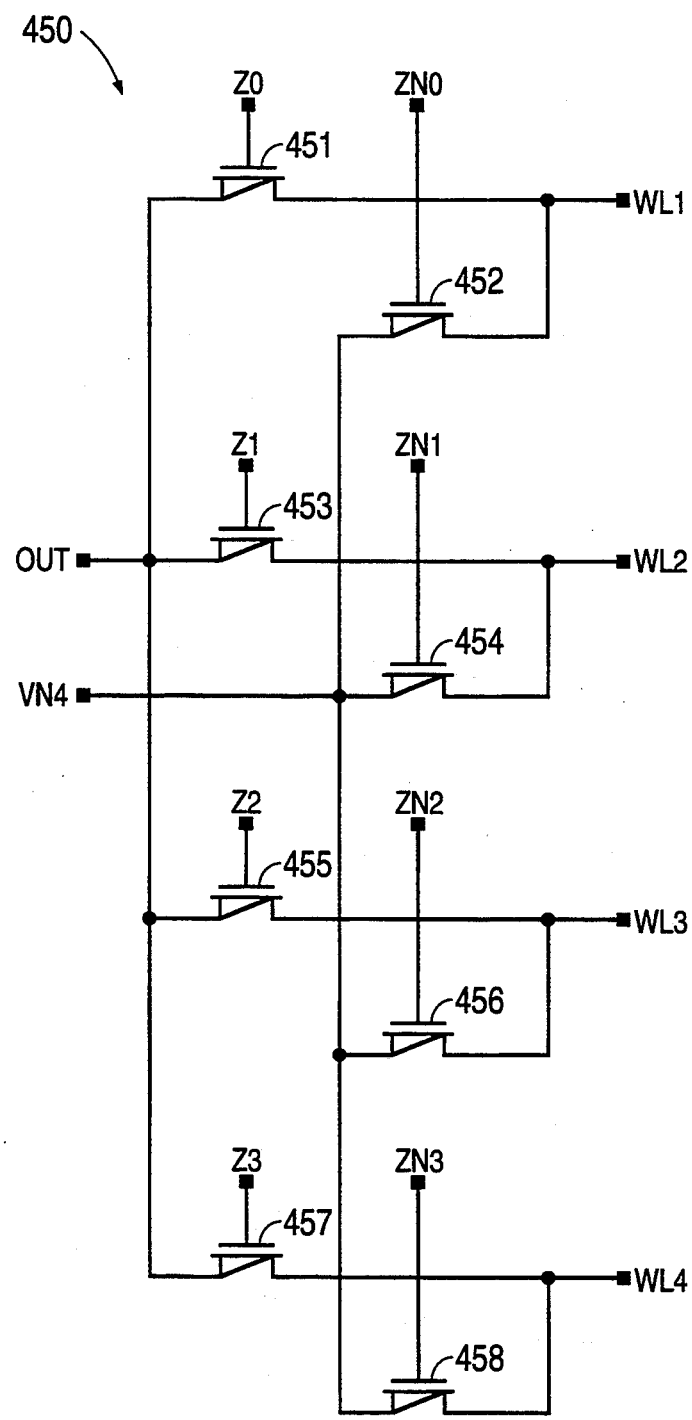

An illustrative implementation of the row decoder 9, which provides the various voltages used in the erase, write and read modes of Table 1 for a group of word lines, is shown in FIG. 5. While only four word lines are shown to preserve clarity, preferably one row decoder decodes three address bits and controls eight word lines. Accordingly, the output OUT of the voltage section 400 of FIG. 5A is switched to the addressed word line by the switch section 450 of FIG. 5B. This particular arrangement of the voltage section 400 and the switch section 450 allows optimization of the layout of the row decoder 9. Illustratively, the bodies, or n-wells, of the various PMOS transistors in the decoder of FIG. 5 are connected to $V_{PP}$, while the bodies, either substrate or p-wells, of the various NMOS transistors are connected to ground. WR designates a write enable signal, ERORD designates an erase or read signal, PHI designates a clock signal, PHIB designates the complement of the clock signal PHI, RA0 designates the first bit of the row address, RA1 designates the second bit of the row address, DSELB represents the complement of the deselect signal, $V_{PP}$, $V_{PP2}$, VN1, VN2, and VN3 represent various select voltages depending on the mode of operation of the memory 1 (see Table 3), and VN4 represents various deselect voltages depending on the mode of operation of the memory 1 (see Table 3). Voltages $V_{PP}$, $V_{PP2}$, VN1, VN2, VN3 and VN4 are obtained from various charge pumps or voltage regulators (not shown) that service the memory 1.

TABLE 3

| MODE | ($V_{cc}$ = 5 volts) | | | | | |
|---|---|---|---|---|---|---|
| | VN1 | VN2 | VN3 | VN4 | VPP | VPP2 |
| ERASE | — | 0 | 0 | 0 | 20 | 20 |
| WRITE | −15 | −15 | −15 | −1 | 5 | 5 |
| READ | −1 | 0 | 0 | 0 | 5 | 2.5 |

NAND gate 402, inverter 406, and n-channel transistors 404 and 408 comprise a decoder circuit 401. Selection of one of the four word lines is made if either address bit RA0 and RA1 is a logic one, or if the deselect signal DSELB is a logic one. In erase and read modes, the transistor 404 is made conductive by signal ERORD, and the output of the decoder circuit at node 409 is $V_{CC}$ (typically three or five volts) if any of the four associated word lines WL1, WL2, WL3 and WL4 is selected, and reference potential (typically zero volts) if none of the four associated word lines WL1, WL2, WL3 and WL4 is selected. In write mode, the transistor 408 is made conductive by signal WR, and the output of the decoder circuit at the node 409 is $V_{CC}$ if none of the four associated word lines WL1, WL2, WL3 and WL4 is selected, and reference potential if any of the four associated word lines WL1, WL2, WL3 and WL4 is selected. The reversal of the logic output of the control circuit at node 409 is useful for properly selecting the reverse voltages needed for the write mode, relative to the erase mode.

A voltage converter circuit 410 comprises p-channel transistor 411 and inverter 412. Transistor 411 is connected in a "weak" feedback loop from the output of the converter circuit at node 418 to the input of the converter circuit at node 409. When node 409 is zero volts, node 418 is pulled up to $V_{PP}$ through p-channel transistor 414. Transistor 411 is OFF. When node 409 is $V_{CC}$, typically three or five volts, node 418 is pulled down through n-channel transistor 416. Transistor 411 turns ON, thereby pulling up node 409 to $V_{PP}$.

A voltage generator circuit 420 comprises a p-channel isolation transistor 422, a p-channel pulldown transistor 424, and two charge pumps 430 and 440. The use of two charge pumps 430 and 440 allows charge pumping to occur on the leading and trailing edges of the clock signal. P-channel transistors 426 and 428 are provided to buffer the output voltage on line 423.

In the erase mode (assuming a five volt supply), $V_{PP}$ is 20 volts, VN1 is don't care, VN2 is zero volts, VN3 is zero volts, VN4 is zero volts, ERORD is five volts, WR is zero volts, and PHI and PHIB are inactive. The voltage generator 420 operates as follows. If a word line is selected from the group of word lines to which the voltage section 400 is connected, node 409 is zero volts and node 418 is twenty volts. Transistor 422 is ON, transistor 424 is OFF, and charge pumps 430 and 440 are inactive, so that line 423 is pulled up to $V_{PP}$, or twenty volts. Transistor 426 controlled by node 409 is ON and transistor 429 controlled by line 423 is OFF, so that the output 429 is twenty volts. If no word line is selected from the group of word lines to which the voltage section 400 is connected, node 409 is twenty volts and node 418 is zero volts. Transistor 422 is OFF, transistor 424 is ON, and charge pumps 430 and 440 are inactive, so that line 423 is pulled down to VN2, or zero volts. Transistor 426 controlled by node 409 is OFF and transistor 429 controlled by line 423 is ON, so that the output 429 is zero volts. Note that if one desires to achieve the voltages of Table 2 using the voltage generator circuit 420, the charge pumps 430 and 440 will need to be active.

In the write mode (assuming a five volt supply), $V_{PP}$ is 5 volts, VN1 is minus fifteen volts, VN2 is minus fifteen volts, VN3 is minus fifteen volts, VN4 is minus one volt, ERORD is zero volts, WR is five volts, and PHI and PHIB are active. The voltage generator 420 operates as follows. If a word line is selected from the group of word lines to which the voltage section 400 is connected, node 409 is five volts and node 418 is zero volts. Note that this result is influenced by the inversion of the output Of the NAND gate 402 by the inverter 406. Transistor 422 is OFF and transistor 424 is ON, so that line 423 is pulled down to VN2. However, charge pumps 430 and 440 are also active, so that line 423 is further pulled down to one $V_t$ below VN2, or minus sixteen point five volts, assuming VN2 is minus fifteen volts and $V_t$ is one and a half volts. Transistor 426 controlled by node 409 is OFF and transistor 429 controlled by line 423 is ON, so that the output 429 is minus fifteen volts.

The charge pumps 430 and 440 operate in an identical manner, except that they are clocked on opposite edges of the clock signal. Charge pump 430 operates as follows. P-channel transistor 432 is connected as a capacitor. When PHI makes a transition from zero to five volts, node 434 is coupled positive relative to line 423 and transistor 438 momentarily turns ON, thereby charging capacitor 432. When PHI makes a transition form five to zero volts, node 434 is coupled negative relative to line 423 and transistor 436 momentarily turns ON, thereby pulling down line 423. This process continues for a number of clock pulses until line 423 is pulled down to one $V_t$ below VN2.

If no word line is selected from the group of word lines to which the voltage section 400 is connected, node 409 is zero volts and node 418 is five volts. Transistor 422 is ON and transistor 424 is OFF, so that line 423 is pulled up to vive volts. Even though charge pumps 430 and 440 are active, they are not able to pull down the five volts on line 423. Transistor 426 controlled by node 409 is ON and transistor 429 controlled by line 423 is OFF, so that the output 429 is five volts.

In the read mode (assuming a five volt supply), $V_{PP}$ is five volts, $V_{PP2}$ is two and a half volts, VN1 is minus one volt, VN2 is zero volts, VN3 is zero volts, VN4 is zero volts, ERORD is five volts, WR is zero volts, and PHI and PHIB are active. The voltage generator 420 operates as follows. If a word line is selected from the group of word lines to which the voltage section 400 is connected, node 409 is zero volts and node 418 is two and a half volts. Transistor 422 is ON and transistor 424 is OFF, so that line 423 is pulled up to $V_{PP}$, or five volts. Although charge pumps 430 and 440 are active, they have no effect on line 423. Transistor 426 controlled by node 409 is ON and transistor 428 controlled by line 423 is OFF, so that the output 429 is two and a half volts. If no word line is selected from the group of word lines to which the voltage section 400 is connected, node 409 is five volts and node 418 is zero volts. Transistor 422 is OFF, transistor 424 is ON, and charge pumps 430 and 440 are active, so that line 423 is pulled down to VN1, or minus one volt. Transistor 426 controlled by node 409 is OFF and transistor 428 controlled by line 423 is ON, so that the output 429 is zero volts.

The output 429 of the voltage section 400 is applied to p-channel transistors 451, 453, 455 and 457 of the switch section 450. The deselect voltage VN4 is applied to p-channel transistors 452, 454, 456 and 458 of the switch section 450. Row address bits RA0 and RA1 are decoded in any well known manner to provide true signals Z0, Z1, Z2 and Z3 to the transistors 451, 453, 455 and 457 respectively, and complement signals ZN0, ZN1, ZN2 and ZN3 to the transistors 452, 454, 456 and 458 respectively. In accordance with the values of true signals Z1, Z2, Z3 and Z4 and their complements, the voltages OUT and VN4 are appropriately furnished to word lines WL1, WL2, WL3 and WL4.

The recognition that both negative and positive voltages can be used to adjust the $V_t$ of the memory transistors affords considerable design freedom. For example, if minimal bit line sizing is sought in the layout of a memory array, the use of negative voltages in adjusting $V_t$ enables bit line voltage for the memory array to be specified over a narrow range. Although the word lines still need to be designed for relatively high level voltages, the bit lines may be designed for relatively low level voltages. On the other hand, if the process restricts the voltage range on the word lines, the balance of the required tunneling voltage may be applied to the substrate and bit lines. Generally, many factors typically considered in memory design can selectively be minimized, maximized, or compromised by using negative voltages in conjunction with reference or positive voltage to adjust the $V_t$ of the memory transistors.

While the invention has been described with respect to the embodiments set forth above, the invention is not necessarily limited to these embodiments. For example, the invention is not necessarily limited to the particular arrangement of transistors described; to the specific supply voltages or signal voltages, or ranges of voltages, mentioned; or to the specific types of transistors or transistor characteristics set forth, as specific arrangements and values depend on the characteristics desired of the memory product. Moreover, the invention is not necessarily limited to the particular voltage level of the bodies of the transistors, because the voltage level of the bodies can be varied to accommodate the breakdown characteristics of the transistors. Accordingly, other embodiments, variations and improvements not described herein are not necessarily excluded from the scope of the invention, which is defined by the following claims.

What is claimed is:

1. A memory array operative at different times in an erase mode, a program mode, and a read mode, comprising:
   a first settable threshold memory cell having a control terminal and first and second controlled terminals, wherein the threshold is set by application of a voltage across the control terminal and the first controlled terminal thereof;
   a second settable threshold memory cell having a control terminal and first and second controlled terminals, wherein the threshold is set by application of a voltage across the control terminal and the first controlled terminal thereof;
   a first switch having a control terminal and first and second controlled terminals;
   a second switch having a control terminal and first and second controlled terminals;
   an array reference line connected to the respective first controlled terminals of the first and second switches, the respective second controlled terminals of the first and second switches being connected to one another by a common line;
   a bit line connected to the respective first controlled terminals of the first and second memory cells, the respective second controlled terminals of the first and second switches being connected to the common line;
   a first word line connected to the respective control terminals of the first memory cell and the first switch; and
   a second word line connected to the respective control terminals of the second memory cell and the second switch.

2. A memory array as in claim 1, wherein:
   the first and second word lines are operative in the erase mode to apply, in conjunction with the bit line, a high level voltage of a first polarity across a particular one or more of the first and second memory cells;
   the first and second word lines are operative in the program mode to apply, in conjunction with the bit line, a high level voltage of a second polarity opposite the first polarity to a particular one or more of the first and second memory cells;
   the first word line is operative in the read mode to select at particular times the first memory cell by application of a low level voltage to the control terminal thereof; and
   the second word line is operative in the read mode to select at particular times the second memory cell by application of a low level voltage to the control terminal thereof.

3. A memory array comprising:
   a first adjustable threshold transistor having a gate, a floating gate, and first and second current terminals, the first adjustable threshold transistor supporting Fowler-Nordheim tunneling between the first current terminal and the floating gate thereof;
   a second adjustable threshold transistor having a gate, a floating gate, and first and second current terminals, the second adjustable threshold transistor supporting Fowler-Nordheim tunneling between the first current terminal and the floating gate thereof;
   a first switch transistor having a gate and first and second current terminals;
   a second switch transistor having a gate and first and second current terminals;
   an array reference line connected to the first current terminals of the first and second switches;
   a common line connected to the second current terminals of the first and second switches and the second current terminals of the first and second adjustable threshold transistors;
   a bit line connected to the first current terminals of the first and second adjustable threshold transistors;
   a first word line connected to the gates of the first adjustable threshold transistor and the first switch; and
   a second word line connected to the gates of the second adjustable threshold transistor and the second switch.

4. A memory array as in claim 3 further comprising a sense circuit controllably connected to the bit line, the first and second adjustable threshold transistors generally conducting a first current value when in depletion and generally conducting a second current when on, and the sense circuit having a current sensing threshold between the first and second current values.

5. A memory array as in claim 4 further comprising:
   a column select terminal; and
   a third switch transistor having a gate connected to the column select terminal, the sense circuit being a sense amplifier controllably connected to the bit line through the third switch transistor.

6. A memory array as in claim 5 further comprising:
   a precharge control terminal;
   a voltage node; and
   a fourth switch transistor having a gate connected to the precharge control terminal, the voltage node being controllably connected to the bit line through the fourth switch transistor.

7. A memory array as in claim 3 further comprising a latch controllably connected to the bit line.

8. A memory array as in claim 7 further comprising:
   a load terminal; and
   a third switch transistor having a gate connected to the load terminal, the latch being a pair of cross-coupled inverters controllably connected to the bit line through the third switch transistor.

9. A memory array as in claim 3 operative at different times in an erase mode, a program mode, and a read mode, further comprising:
   means for applying in erase mode a first erase voltage on the bit line and a second erase voltage on the first word line, the first erase voltage being of a value relative to the second erase voltage to establish a low threshold voltage on the first adjustable threshold transistor by Fowler-Nordheim tunneling from the first current terminal of the first adjustable threshold transistor to the floating gate of the first adjustable threshold transistor; and
   means for applying in program mode a first program voltage on the bit line and a second program voltage on the first word line, the first program voltage being of a value relative to the second program voltage to establish a high threshold voltage on the first adjustable threshold transistor by Fowler-Nordheim tunneling from the floating gate of the first adjustable threshold transistor to the first current terminal of the first adjustable threshold transistor.

10. A method for operating a memory array as in claim 3 in, at different times, and erase mode and a write mode, comprising the steps of:

furnishing a first erase mode voltage on the bit line;

furnishing a second erase mode voltage on the first word line, the second erase mode voltage being of a first polarity and having a magnitude relative to the first erase mode voltage so that a first threshold voltage indicative of a first logical state is established in the first adjustable threshold transistor by Fowler-Nordheim tunneling between the first current terminal and the floating gate of the first adjustable threshold transistor;

furnishing a first program mode voltage on the bit line indicative of a second logical state opposite the first logical state; and furnishing a second program mode voltage on the first word line, the second program mode voltage being of a second polarity opposite the first polarity and having a magnitude relative to the first program mode voltage so that a second threshold voltage indicative of the second logical state is established in the first adjustable threshold transistor by Fowler-Nordheim tunneling between the first current terminal and the floating gate of the first adjustable threshold transistor.

11. A method as in claim 10 wherein the first erase mode voltage is zero volts indicative of a logical one, the second erase mode voltage is twenty volts, the first program mode voltage is five volts indicative of a logical zero, and the second program mode voltage is minus fifteen volts.

12. A method as in claim 10 further comprising the step of furnishing the first erase mode voltage as a substrate bias for the first adjustable threshold transistor so that establishment of the first threshold voltage indicative of a first logical state in the first adjustable threshold transistor is assisted by Fowler-Nordheim tunneling between the substrate and the floating gate of the first adjustable threshold transistor.

13. A method as in claim 12 wherein the first erase mode voltage is minus four volts indicative of a logical one, the second erase mode voltage is fifteen volts, the first program mode voltage is five volts indicative of a logical zero, and the second program mode voltage is minus fifteen volts.

14. A method as in claim 10 further comprising the steps of:

furnishing a third erase mode voltage on the second word line, the third erase mode voltage being of a polarity and magnitude relative to the first erase mode voltage to avoid Fowler-Nordheim tunneling between the first current terminal and the floating gate of the second adjustable threshold transistor, wherein a threshold voltage state of the second adjustable threshold transistor is unchanged; and furnishing a third program mode voltage on the second word line, the third program voltage being of a polarity and magnitude relative to the first program mode voltage to avoid Fowler-Nordheim tunneling between the first current terminal and the floating gate of the second adjustable threshold transistor, wherein a threshold voltage state of the second adjustable threshold transistor is unchanged.

15. A method as in claim 14 wherein the polarity and magnitude of the third program mode voltage is equal to or less than an anticipated negative threshold voltage of the second adjustable threshold transistor to ensure that no conduction path forms therethrough.

16. A method as in claim 15 wherein the first erase mode voltage is zero volts indicative of a logical one, the second erase mode voltage is twenty volts, the third erase mode voltage is zero volts, the first program mode voltage is five volts indicative of a logical zero, the second program mode voltage is minus fifteen volts, and the third program mode voltage is minus one volt.

17. A method as in claim 10 further comprising the steps of:

furnishing the second erase mode voltage on the second word line so that a first threshold voltage indicative of a first logical state is established in the second adjustable threshold transistor by Fowler-Nordheim tunneling between the first current terminal and the floating gate of the second adjustable threshold transistor; and furnishing a third program mode voltage on the second word line, the third program voltage being of a polarity and magnitude relative to the first program mode voltage to avoid Fowler-Nordheim tunneling between the first current terminal and the floating gate of the second adjustable threshold transistor so that a threshold voltage state of the second adjustable threshold transistor is unchanged.

18. A method as in claim 17 wherein the polarity and magnitude of the third program mode voltage is equal to or less than an anticipated negative threshold voltage of the second adjustable threshold transistor to ensure that no conduction path forms therethrough.

19. A method as in claim 18 wherein the first erase mode voltage is zero volts indicative of a logical one, the second erase mode voltage is twenty volts, the first program mode voltage is five volts indicative of a logical zero, the second program mode voltage is minus fifteen volts, and the third program mode voltage is minus one volt.

20. A method for operating a memory array as in claim 3 in, at different times, and erase mode and a write mode, comprising the steps of:

furnishing a first erase mode voltage on the bit line;

furnishing a second erase mode voltage on the first word line, the second erase voltage being of a first polarity and having a magnitude relative to the first erase mode voltage so that a first threshold voltage indicative of a first logical state is established in the first adjustable threshold transistor by Fowler-Nordheim tunneling between the first current terminal and the floating gate of the first adjustable threshold transistor;

furnishing on the bit line at different times a first program mode voltage indicative of a second logical state opposite the first logical state, and a second program mode voltage indicative of the first logic state; and furnishing a third program mode voltage on the first word line, the third program mode voltage being of a second polarity opposite the first polarity, having a magnitude relative to the first program voltage so that a second threshold voltage indicative of the second logical state is established in the first adjustable threshold transistor by Fowler-Nordheim tunneling between the first current terminal and the floating gate of the first adjustable threshold transistor, and having a magnitude relative to the second program mode voltage to avoid Fowler-Nordheim tunneling between the first current terminal and the floating gate of the first adjustable threshold transistor so that a threshold voltage state of the first adjustable threshold transistor is unchanged.

21. A method as in claim 20 wherein the first erase mode voltage is zero volts indicative of a logical one, the second erase mode voltage is twenty volts, the first program mode voltage is five volts indicative of a logical zero, the second program mode voltage is zero volts indicative of a logical one, and the third program mode voltage is minus fifteen volts.

22. A method as in claim 20 wherein the first erase mode voltage is zero volts indicative of a logical one, the second erase mode voltage is twenty volts, the first program mode voltage is five volts indicative of a logical zero, the second program mode voltage is a floating condition indicative of a logical one, and the third program mode voltage is minus fifteen volts.

23. A method for operating a memory array as in claim 3 in a read mode, wherein the first adjustable threshold transistor is set at a threshold value indicative of a logical state, the threshold value being one of a low threshold indicative of a first logical state and a high threshold indicative of a second logical state, comprising the steps of:
  furnishing a first read mode voltage on the bit line; and
  furnishing a second read mode voltage on the first word line, the second read mode voltage being of a value to cause the first adjustable threshold transistor to conduct when the threshold value thereof is a low threshold, and to avoid causing conduction in the first adjustable threshold transistor when the threshold value thereof is a high threshold.

24. A method as in claim 23 wherein the first read mode voltage is 1.5 volts, and the second read mode voltage is 2.5 volts.

25. A method as in claim 23 wherein the first and second adjustable threshold transistors generally conduct a first current value when in depletion and generally conduct a second current when the second read mode voltage is applied thereto, and wherein the first read mode voltage is a precharge voltage, further comprising the step of sensing current flow on the bit line with a sensing threshold between the first and second current values.

26. A memory array comprising:
a first subarray comprising:
  a first adjustable threshold transistor having a gate, a floating gate, and first and second current terminals, the first adjustable threshold transistor supporting Fowler-Nordheim tunneling between the first current terminal and the floating gate thereof;
  a second adjustable threshold transistor having a gate, a floating gate, and first and second current terminals, the second adjustable threshold transistor supporting Fowler-Nordheim tunneling between the first current terminal and the floating gate thereof; and
  a first common node, the second current terminals of the first and second adjustable threshold transistors being connected to the first common node;

a second subarray comprising:
  a third adjustable threshold transistor having a gate, a floating gate, and first and second current terminals, the first adjustable threshold transistor supporting Fowler-Nordheim tunneling between the first current terminal and the floating gate thereof;
  a fourth adjustable threshold transistor having a gate, a floating gate, and first and second current terminals, the second adjustable threshold transistor supporting Fowler-Nordheim tunneling between the first current terminal and the floating gate thereof; and
  a second common node, the second current terminals of the first and second adjustable threshold transistors being connected to the second common node;

a first word line connected to the gate of the first adjustable threshold transistor;
a second word line connected to the gate of the second adjustable threshold transistor;
a third word line connected to the gate of the third adjustable threshold transistor;
a fourth word line connected to the gate of the fourth adjustable threshold transistor; and
a bit line connected to the first current terminals of the first, second, third and fourth adjustable threshold transistors;
wherein the first common node is at a reference potential when either of the first and second word lines is selected, and is at a potential determined by the bit line when neither of the first and second word lines is selected and either of the first and second adjustable threshold transistors is in depletion; and wherein the second common node is at a reference potential when either of the third and fourth word lines is selected, and is at a potential determined by the bit line when neither of the third and fourth word lines is selected and either of the third and fourth adjustable threshold transistors is in depletion.

27. A memory array as in claim 26 further comprising a sense circuit controllably connected to the bit line, the first, second, third and fourth adjustable threshold transistors generally conducting a first current value when in depletion and generally conducting a second current when on, and the sense circuit having a current sensing threshold between the first and second current values.

28. A memory array as in claim 27 further comprising:
  a precharge control terminal;
  a voltage node; and
  a switch connected to the precharge control terminal, the voltage node being controllably connected to the bit line through the switch for precharging the bit line prior to a read cycle.

29. A memory array as in claim 26 further comprising an array reference voltage line, wherein:
the first subarray further comprises:
  a first switch transistor having a gate connected to the first word line, a first current terminal connected to the array reference voltage line, and a second current terminal connected to the first common node; and
  a second switch transistor having a gate connected to the second word line, a first current terminal connected to the array reference voltage line, and a second current terminal connected to the first common node; and the second subarray further comprises:
- a third switch transistor having a gate connected to the third word line, a first current terminal connected to the array reference voltage line, and a second current terminal connected to the second common node; and
- a fourth switch transistor having a gate connected to the fourth word line, a first current terminal connected to the array reference voltage line, and a second current terminal connected to the second common node.

30. A method for operating a memory array as in claim 27 in, at different times, and erase mode and a write mode, comprising the steps of:
- furnishing a first erase mode voltage on the bit line;
- furnishing a second erase mode voltage on the first word line, the second erase mode voltage being of a first polarity and having a magnitude relative to the first erase mode voltage so that a first threshold voltage indicative of a first logical state is established in the first adjustable threshold transistor by Fowler-Nordheim tunneling between the first current terminal and the floating gate of the first adjustable threshold transistor;
- furnishing a first program mode voltage on the bit line indicative of a second logical state opposite the first logical state; and
- furnishing a second program mode voltage on the first word line, the second program mode voltage being of a second polarity opposite the first polarity and having a magnitude relative to the first program mode voltage so that a second threshold voltage indicative of the second logical state is established in the first adjustable threshold transistor by Fowler-Nordheim tunneling between the first current terminal and the floating gate of the first adjustable threshold transistor.

31. A method for operating a memory array as in claim 27 in, at different times, and erase mode and a write mode, comprising the steps of:
- furnishing a first erase mode voltage on the bit line;
- furnishing a second erase mode voltage on the first word line, the second erase voltage being of a first polarity and having a magnitude relative to the first erase mode voltage so that a first threshold voltage indicative of a first logical state is established in the first adjustable threshold transistor by Fowler-Nordheim tunneling between the first current terminal and the floating gate of the first adjustable threshold transistor;
- furnishing on the bit line at different times a first program mode voltage indicative of a second logical state opposite the first logical state, and a second program mode voltage indicative of the first logic state; and
- furnishing a third program mode voltage on the first word line, the third program mode voltage being of a second polarity opposite the first polarity, having a magnitude relative to the first program voltage so that a second threshold voltage indicative of the second logical state is established in the first adjustable threshold transistor by Fowler-Nordheim tunneling between the first current terminal and the floating gate of the first adjustable threshold transistor, and having a magnitude relative to the second program mode voltage to avoid Fowler-Nordheim tunneling between the first current terminal and the floating gate of the first adjustable threshold transistor so that a threshold voltage state of the first adjustable threshold transistor is unchanged.

32. A method for operating a memory array as in claim 27 in a read mode, wherein the first adjustable threshold transistor is set at a threshold value indicative of a logical state, the threshold value being one of a low threshold indicative of a first logical state and a high threshold indicative of a second logical state, comprising the steps of:
- furnishing a first read mode voltage on the bit line; and
- furnishing a second read mode voltage on the first word line, the second read mode voltage being of a value to cause the first adjustable threshold transistor to conduct when the threshold value thereof is a low threshold, and to avoid causing conduction in the first adjustable threshold transistor when the threshold value thereof is a high threshold.

* * * * *